United States Patent
Seo et al.

(10) Patent No.: US 7,378,320 B2
(45) Date of Patent: May 27, 2008

(54) METHOD OF FORMING ASYMMETRIC MOS TRANSISTOR WITH A CHANNEL STOPPING REGION AND A TRENCH-TYPE GATE

(75) Inventors: Hyeoung-Won Seo, Yongin-Si (KR); Dong-Hyun Kim, Suwon-Si (KR); Du-Heon Song, Yongin-Si (KR); Sang-Hyun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 298 days.

(21) Appl. No.: 11/021,349

(22) Filed: Dec. 23, 2004

(65) Prior Publication Data

US 2005/0133836 A1 Jun. 23, 2005

(30) Foreign Application Priority Data

Dec. 23, 2003 (KR) .................. 10-2003-0095140

(51) Int. Cl.
*H01L 21/336* (2006.01)

(52) U.S. Cl. ................ 438/286; 257/E21.429

(58) Field of Classification Search ............... 438/286; 257/E21.429

See application file for complete search history.

(56) References Cited

U.S. PATENT DOCUMENTS

| 5,142,640 | A |   | 8/1992  | Iwamatsu ............... 357/23.6 |
| 5,329,148 | A |   | 7/1994  | Aoki ..................... 257/390 |
| 5,371,394 | A | * | 12/1994 | Ma et al. ................ 257/335 |
| 5,650,340 | A | * | 7/1997  | Burr et al. .............. 438/286 |
| 5,693,547 | A |   | 12/1997 | Gardner et al. ........... 437/40 |

* cited by examiner

*Primary Examiner*—Howard Weiss
(74) *Attorney, Agent, or Firm*—Monica H. Choi

(57) ABSTRACT

A MOS (metal oxide semiconductor) transistor with a trench-type gate is fabricated with a channel stopping region for forming an asymmetric channel region for reducing short channel effects. For example in fabricating an N-channel MOS transistor, a gate structure is formed within a trench that is within a P-well. A channel stopping region with a P-type dopant is formed to a first side of the trench to completely contain an N-type source junction therein. An N-type drain junction is formed within a LDD region to a second side of the trench, thus forming the asymmetric channel region.

11 Claims, 18 Drawing Sheets

METHOD OF FORMING ASYMMETRIC MOS TRANSISTOR WITH A CHANNEL STOPPING REGION AND A TRENCH-TYPE GATE

BACKGROUND OF THE INVENTION

This application claims priority to Korean Patent Application No. 2003-0095140, filed on Dec. 23, 2003, in the Korean Intellectual Property Office, the disclosure of which is incorporated herein in its entirety by reference.

1. Field of the Invention

The present invention relates generally to integrated circuits, and more particularly to fabrication of a MOS (metal oxide semiconductor) transistor with a trench-type gate and an asymmetric channel region for minimizing undesired short channel effects.

2. Description of the Related Art

A MOSFET (metal oxide semiconductor field effect transistors) is a commonly used device in integrated circuits. Dimensions of integrated circuit devices are desired to be further minimized as known to one of ordinary skill in the art. The channel length of a MOSFET is reduced to deep sub-micron dimensions for enhanced operating speed and current drive capability of the MOSFET.

With such decreased channel length, the depletion regions of the source and drain encroach into the channel resulting in reduction of the effective channel length and the threshold voltage of the MOSFET. Such reduced effective channel length and threshold voltage disadvantageously lead to short channel effects as the gate control function is degraded for the MOSFET.

For preventing such short channel effects, shallow source and drain junctions and a doped region under the channel are formed. The doped region is doped with a dopant having a conductivity that is opposite to that for the source and drain junctions. However, a high electric field is applied for such a MOSFET resulting in hot carrier injection into the gate dielectric which becomes degraded.

For preventing such hot carrier generation, LDD (Lightly Doped Drain) structures are provided. A LDD structure acts as a buffer region with a low dopant concentration toward the channel region from the source/drain junction having higher dopant concentration.

Nevertheless with ever decreasing channel length, even the LDD structures provide limited reduction of short channel effects and hot carrier injection. Furthermore, during operation of the MOS transistor, undesired punch-through may also occur even with such LDD structures.

Because of such disadvantageous effects from a short channel, a MOS transistor is formed with a trench-type gate for lengthening the channel especially for a low area of the MOS transistor. Alternative terms for the trench-type gate are recess-type or groove-type gate.

FIGS. 1A to 1Q are cross-sectional views illustrating the steps of fabricating such a MOS transistor with a trench-type gate according to the prior art. Referring to FIG. 1A, a first pad oxide layer 12 and a first hard mask layer 14 are sequentially formed on a semiconductor substrate 10. Referring to FIGS. 1A and 1B, photoresist is deposited on the first hard mask layer 14, and is then patterned to partially expose the hard mask layer 14. Exposed regions of the first hard mask layer 14 are etched away to define an active device region ACT within the semiconductor substrate 10. Thereafter, the photoresist is removed.

Referring to FIGS. 1B and 1C, exposed portions of the first pad oxide layer 12 and the semiconductor substrate 10 are sequentially etched. By thus using the first hard mask layer 14 as an etch mask, a first trench T1 is formed to surround the active device region ACT within the semiconductor substrate 10.

Referring to FIGS. 1C and 1D, an insulating material 16 is formed within the first trench T1. Such insulating material 16 is formed in a thermal oxidation process with the first hard mask layer 14 and the first pad oxide layer 12 being oxidation prevention masks. Thereafter, the first hard mask layer 14 and the first pad oxide layer 12 are removed by a chemical mechanical polishing (CMP) process or an etch back process. After such planarization, a STI (shallow trench isolation) structure 16 is formed to surround the exposed active device region ACT of the semiconductor substrate 10.

Referring to FIGS. 1D and 1E, a P-type dopant is implanted at high energy with relatively low concentration into the semiconductor substrate 10 to form a channel region of the MOS transistor. This channel region is formed substantially into the semiconductor substrate 10, except the STI structure 16, and so does not have a specific reference number in the drawings.

Referring to FIGS. 1E and 1F, a second pad oxide layer 18 and a second hard mask layer 20 are sequentially formed on the semiconductor substrate 10. Referring to FIGS. 1F and 1G, photoresist is deposited and patterned on the second hard mask layer 20 in a photolithography process. Thereafter, exposed portions of the second hard mask layer 20 are etched to pattern the second hard mask layer 20. Next, the photoresist is removed.

Referring to FIGS. 1G and 1H, exposed portions of the second pad oxide layer 18 and the semiconductor substrate 10 are sequentially etched. By thus using the second hard mask layer 20 as an etch mask, a second trench T2 having a predetermined depth is formed within the active device region ACT.

Referring to FIGS. 1H and 1I, the second hard mask layer 20 and the second pad oxide layer 18 are removed to expose surfaces of the semiconductor substrate 10 including the walls of the second trench T2. Referring to FIGS. 1I and 1J, a gate dielectric 22 is formed on any exposed surfaces of the semiconductor substrate 10 including the walls of the second trench T2.

Referring to FIGS. 1J and 1K, a gate electrode 24, a metal layer 26, and an upper gate insulating layer 28 are sequentially deposited. Referring to FIG. 1K, the gate electrode 24 fills the second trench T2.

Referring to FIGS. 1K and 1L, photoresist is deposited and patterned on the upper gate insulating layer 28 to form the gate insulating structure 28, the metal layer 26, and the gate electrode 24 of a gate stack 30 on a gate region G. The portions of the gate insulating material 28, the metal layer 26, and the gate electrode 24 disposed over the source and drain regions S and D and the STI structure 16 are etched away.

Referring to FIGS. 1L and 1M, an N-type dopant is implanted into the source and drain regions S and D of the semiconductor substrate 10 with a relatively low concentration to form LDD (lightly doped drain) regions 32. The gate stack 30 acts as an ion implantation mask in FIG. 1N.

Referring to FIGS. 1M and 1N, a spacer 34 comprised of silicon nitride is formed at sidewalls of each gate stack 30. Referring to FIGS. 1N and 1O, an N-type dopant is implanted into the source and drain regions S and D of the semiconductor substrate 10 with a relatively high concentration to form source and drain junctions 36. The gate stacks 30 and the spacers 34 act as ion implantation masks in FIG. 1O.

Referring to FIGS. 1O and 1P, the portions of the gate dielectric 22 on the source and drain regions S and D are removed. Referring to FIGS. 1P and 1Q, conductive material such as polysilicon doped with N-type dopant is blanket deposited and planarized until the gate insulating structure 28 is exposed to form source and drain electrodes 38 on the source and drain regions S and D, respectively.

Subsequently, a first interlayer insulation layer is deposited, and a portion of the first interlayer insulation layer above the source region S is removed to form a source contact hole. A bit line contact fills the source contact hole to be electrically coupled to the source electrode 38 formed on the source region S.

Thereafter, a second interlayer insulation layer is deposited, and a portion of the first and second interlayer insulation layers above the drain region D is removed to form a drain contact hole. A storage electrode fills the drain contact hole to be electrically coupled to the drain electrode 38 formed on the drain region D. Such a storage electrode is part of a data storage capacitor also having a dielectric layer and a plate electrode when the MOS transistor of FIG. 1Q is for a DRAM (dynamic random access memory) cell. However, the MOS transistor of FIG. 1Q may be used within other types of integrated circuits.

Unfortunately, the prior art MOS transistor formed according to FIGS. 1A to 1Q may still exhibit short channel effects. For example, when the critical dimensions (CD) including the depth of the second trench T2 are reduced, the depth of the source and drain junctions 36 with the relatively higher dopant concentration may not be correspondingly reduced, resulting in increased short channel effects.

In addition, if the depth of the LDD regions 32 approaches the bottom of the second trench T2, the length of the channel is shortened resulting in increased short channel effects. On the other hand, if the depth of the LDD regions 32 is reduced for decreasing short channel effects, the concentration of the N-type impurity is increased in turn resulting in increase of junction leakage current in the drain region D. Such higher junction leakage current in the drain region D degrades the refresh characteristics of the cell capacitor coupled to the drain region D.

Nevertheless, the MOS transistor with the trench-type gate is desired for the lengthened channel to decrease short channel effects. Thus, the MOS transistor with the trench-type gate but without disadvantages of the prior is desired for integrated circuits of high density.

SUMMARY OF THE INVENTION

Accordingly, a MOS (metal oxide semiconductor) transistor with a trench-type gate is fabricated with a channel stopping region for forming an asymmetric channel region to reduce short channel effects.

In a general embodiment of the present invention for fabricating such a MOS transistor, a gate structure is formed within a trench. The trench is formed within a well doped with a first dopant of a first conductivity type. In addition, a second dopant of the first conductivity type is implanted into a first side of the trench to form a channel stopping region therein. Furthermore, a third dopant of a second conductivity type that is opposite of the first conductivity type is implanted into the channel stopping region to form a first source/drain therein. Additionally, a portion of the trench abuts the well for forming a channel of the MOS transistor.

In another embodiment of the present invention, the third dopant of the second conductivity type is also implanted into a second side of the trench to form a second source/drain therein. In that case, a fourth dopant of the second conductivity type is implanted into the second side of the trench to form a lightly doped region with the second source/drain subsequently formed within the lightly doped region.

In an example embodiment of the present invention, the first source/drain is a source of the MOS transistor, and the second source/drain is a drain of the MOS transistor. In another example embodiment of the present invention, the first conductivity type is P-type and the second conductivity type is N-type such that the MOS transistor is an NMOSFET (N-channel Metal Oxide Semiconductor Field Effect Transistor).

Thus for the NMOSFET, one of the N-type source/drain of the MOS transistor is formed within a P-type channel stopping region to form an asymmetric MOS transistor. Such a P-type channel stopping region reduces short channel effects of the MOS transistor with the trench-type gate. In addition, such a P-type channel stopping region may be used to adjust the threshold voltage of the MOS transistor including increasing the threshold voltage of the MOS transistor.

In a further embodiment of the present invention, for forming the gate structure, a gate dielectric is formed at walls of the trench, and a gate electrode is formed to fill the trench. In addition for forming the gate structure, a gate silicide is formed on the gate electrode, and a gate insulating structure is formed on the gate silicide. Thereafter, a spacer is formed at sidewalls of the gate silicide and the gate insulating structure.

BRIEF DESCRIPTION OF THE DRAWINGS

The above and other features and advantages of the present invention will become more apparent when described as detailed embodiments with reference to the attached drawings in which.

The figures referred to herein are drawn for clarity of illustration and are not necessarily drawn to scale. Elements having the same reference number in FIGS. 1A to 1Q and 2A to 2R refer to elements having similar structure and/or function.

DETAILED DESCRIPTION OF THE INVENTION

Figure 1A:
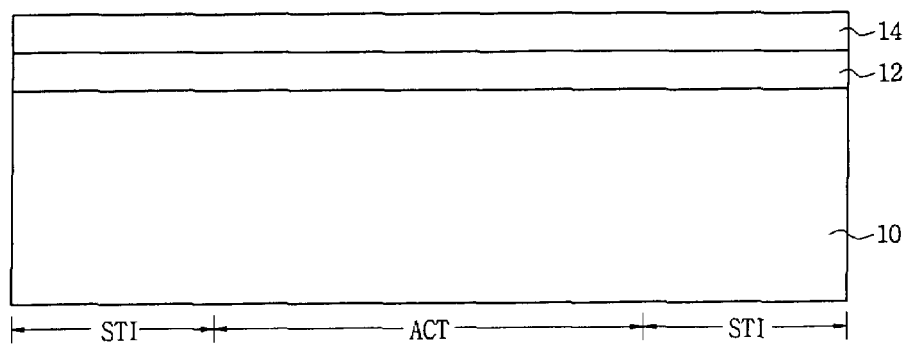
FIGS. 1A to 1Q are cross-sectional views illustrating steps for fabricating a MOS transistor having a trench-type gate, according to a prior art.
Figure 1B:
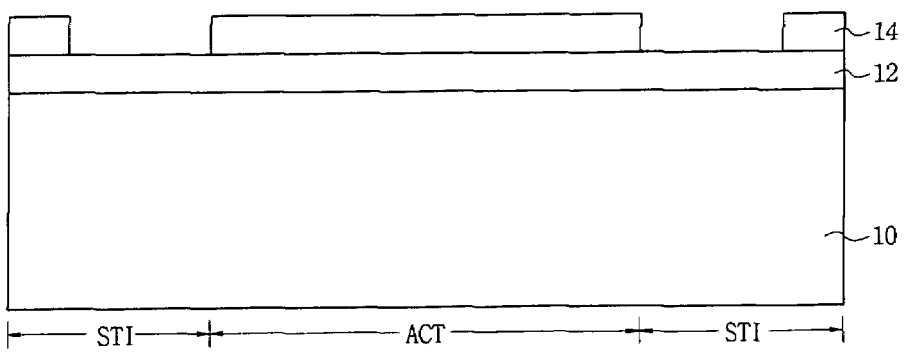
Figure 1C:
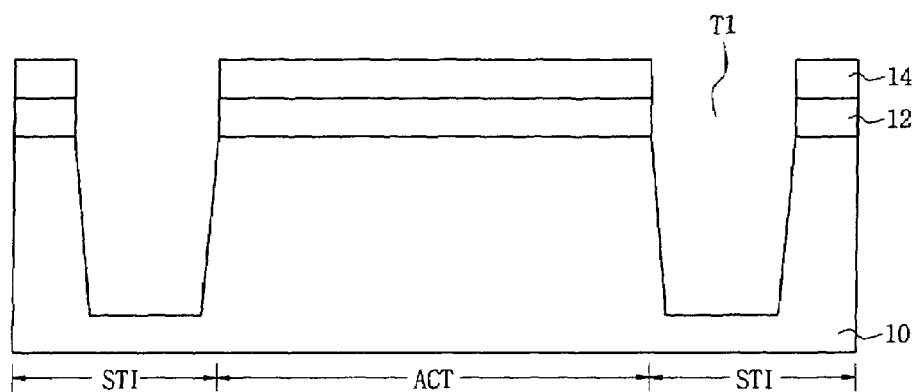
Figure 1D:
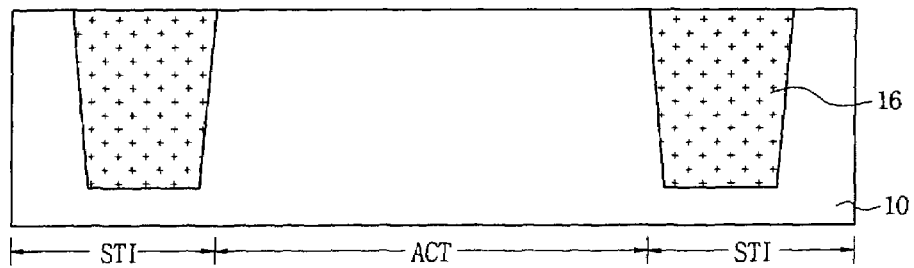
Figure 1E:
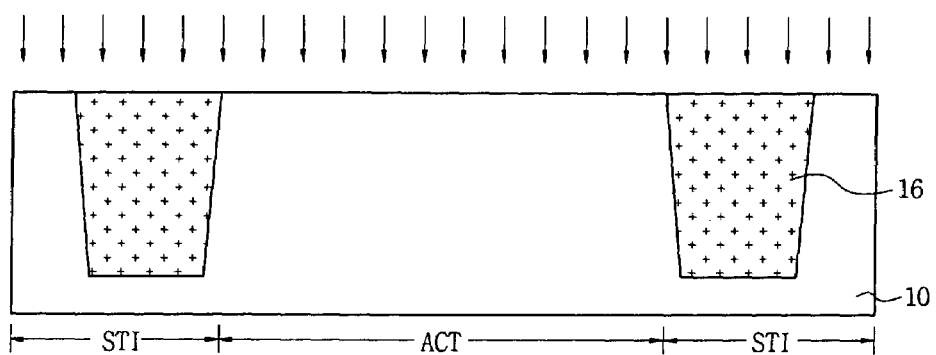
Figure 1F:
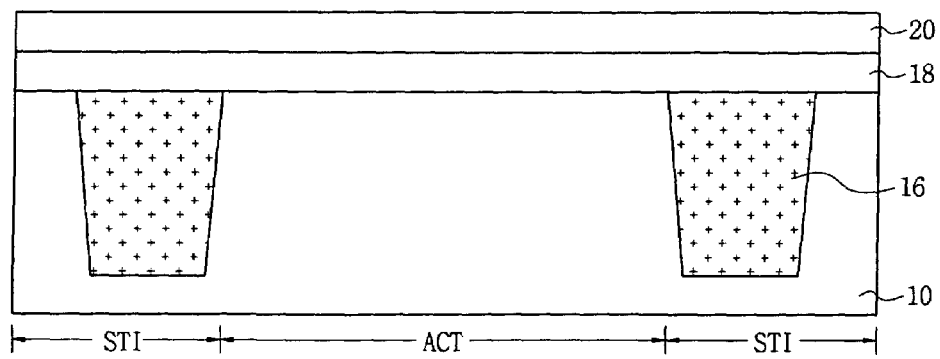
Figure 1G:
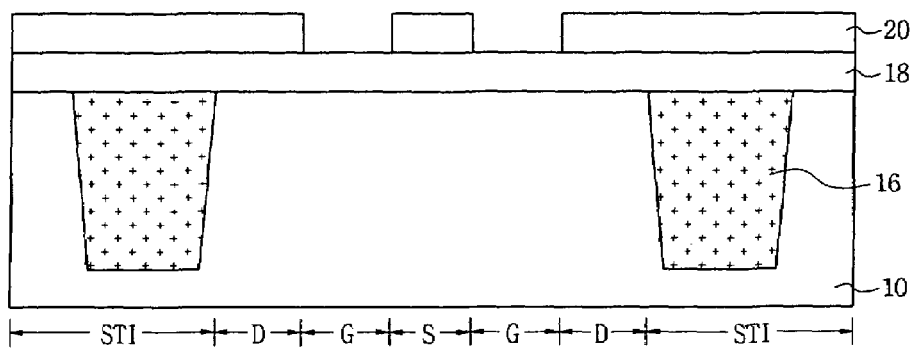
Figure 1H:
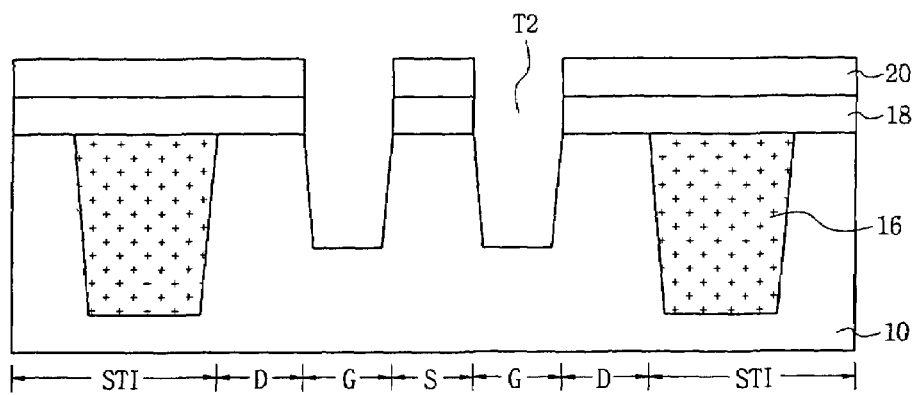
Figure 1I:
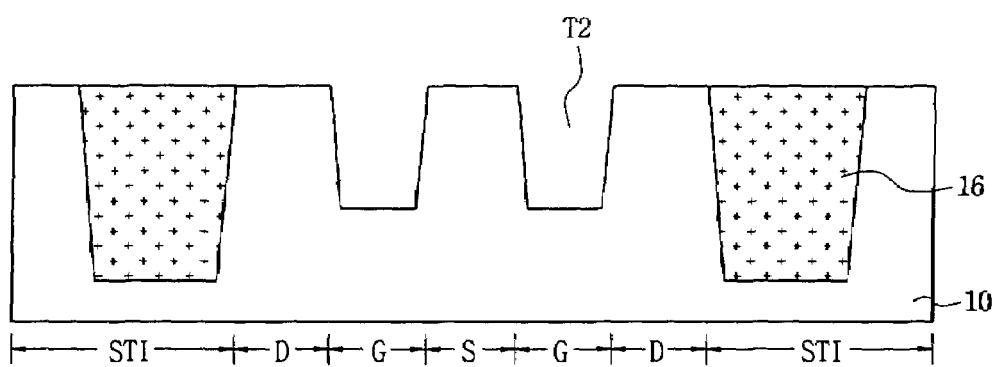
Figure 1J:
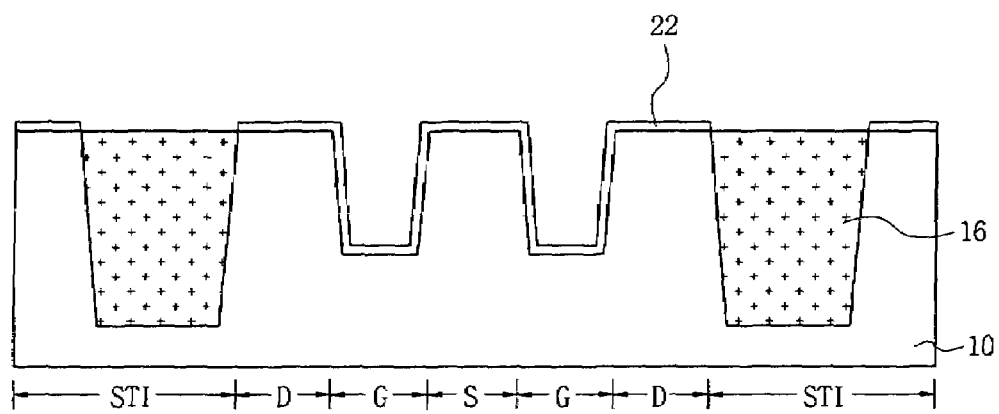
Figure 1K:
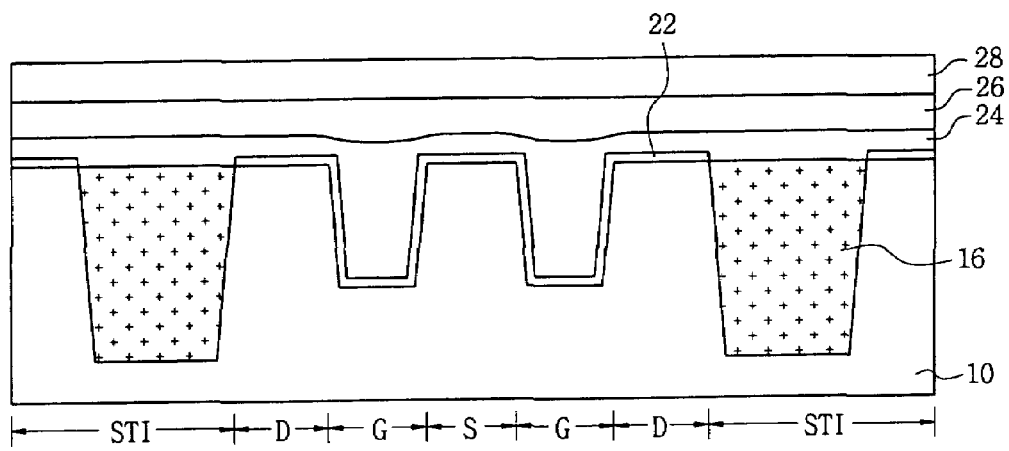
Figure 1L:
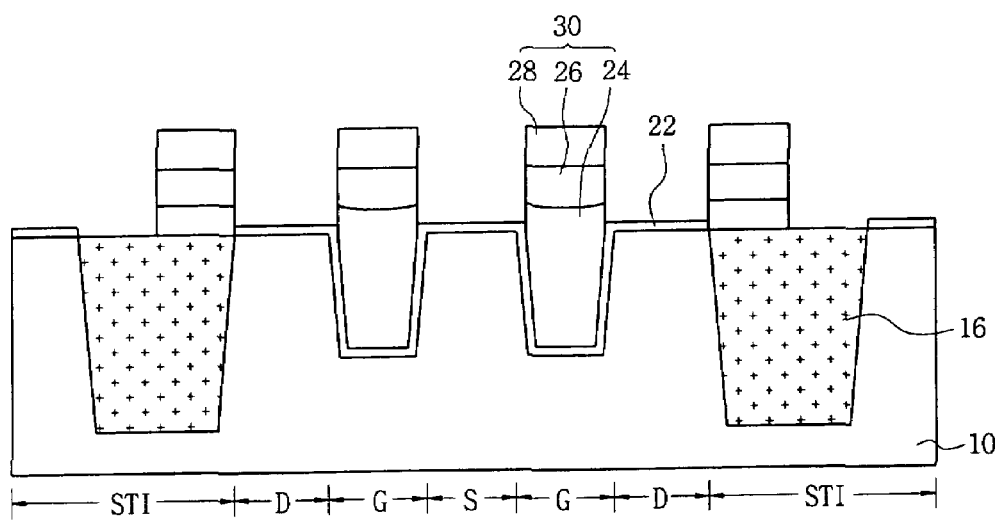
Figure 1M:
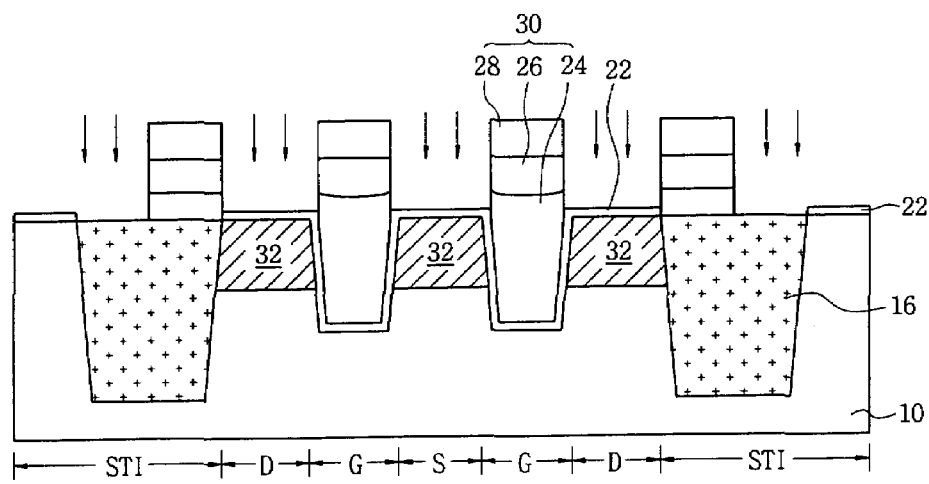
Figure 1N:
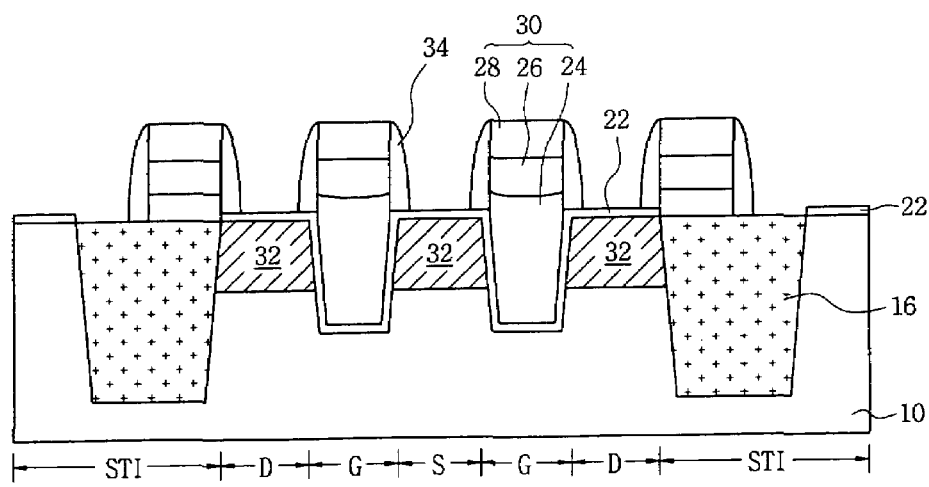
Figure 1O:
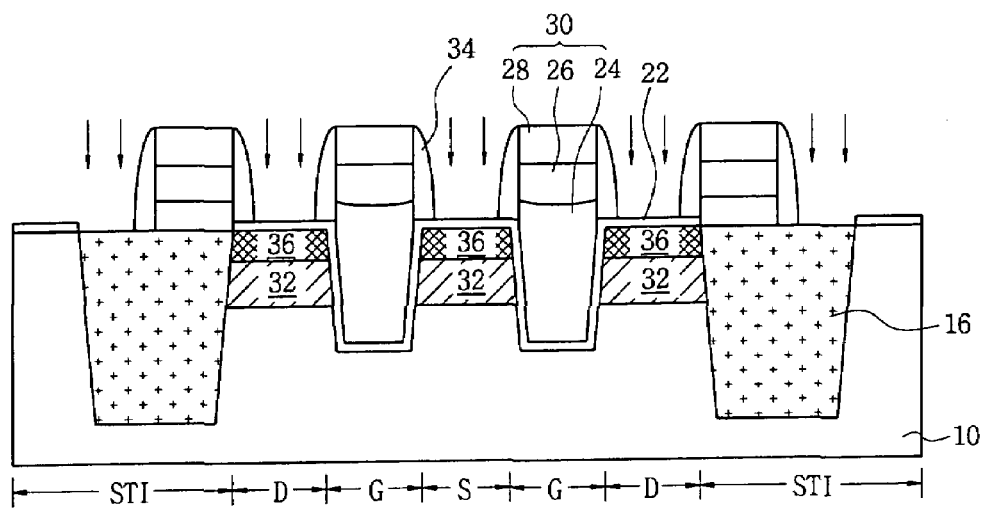
Figure 1P:
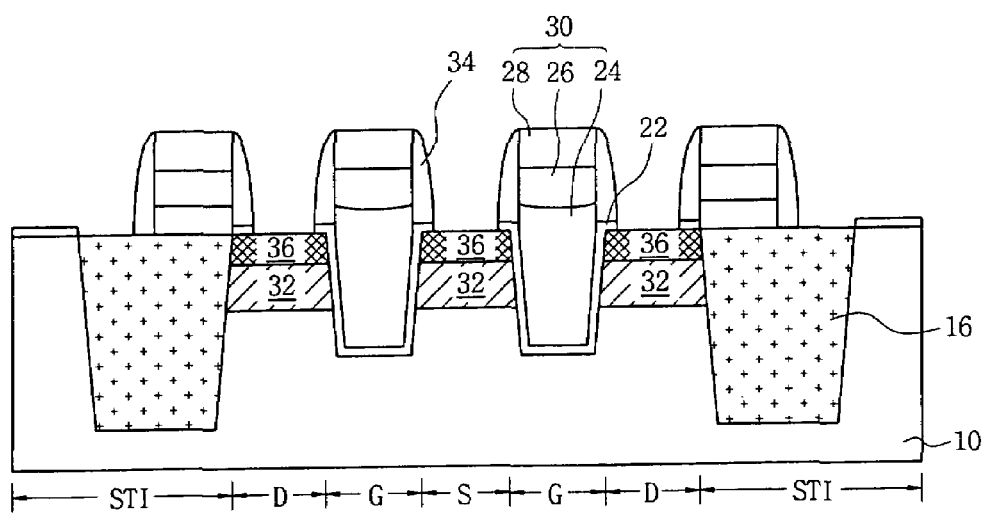
Figure 1Q:
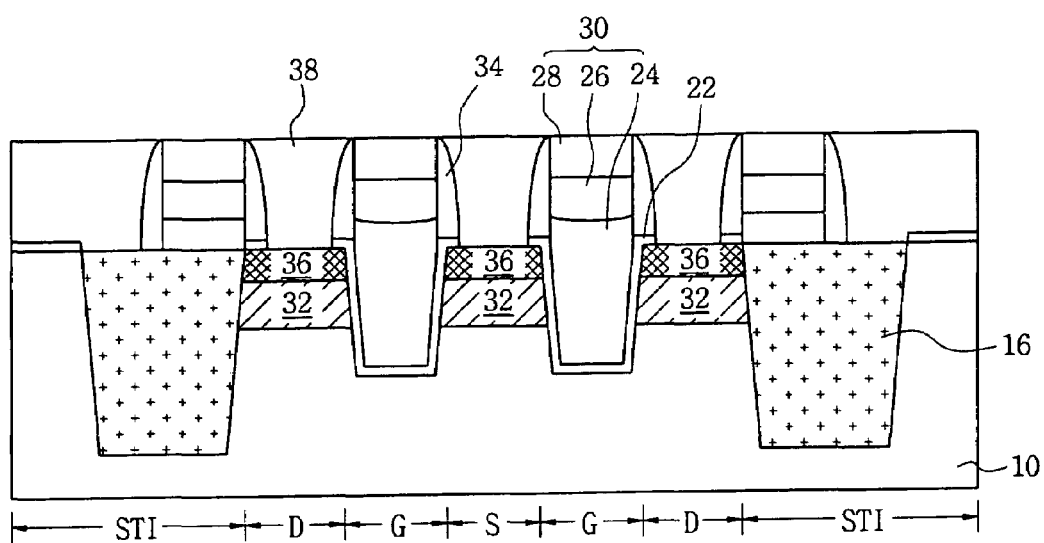
Figure 2A:
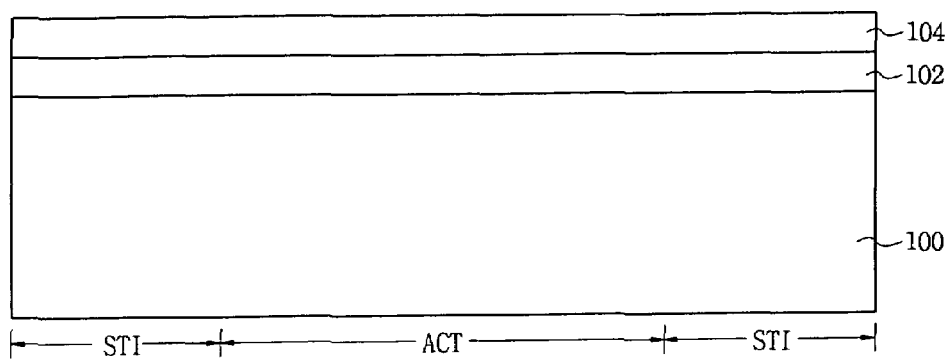
FIGS. 2A to 2R are cross-sectional views illustrating steps for fabricating a MOS transistor having a trench-type gate with an asymmetric channel region, according to an embodiment of the present invention.
Figure 2B:
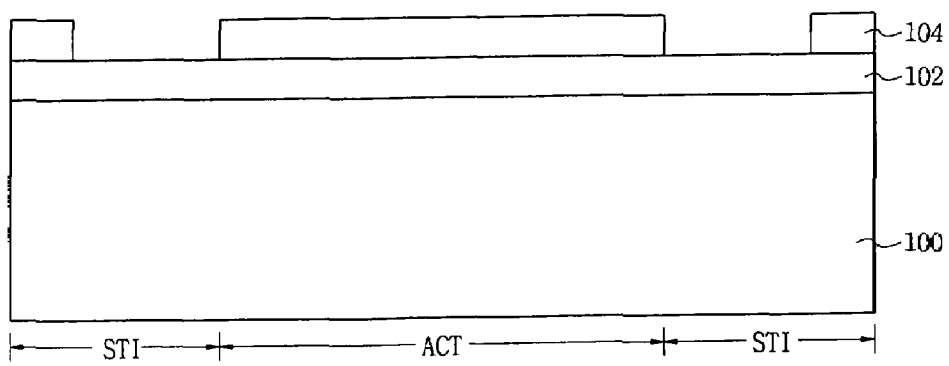
Figure 2C:
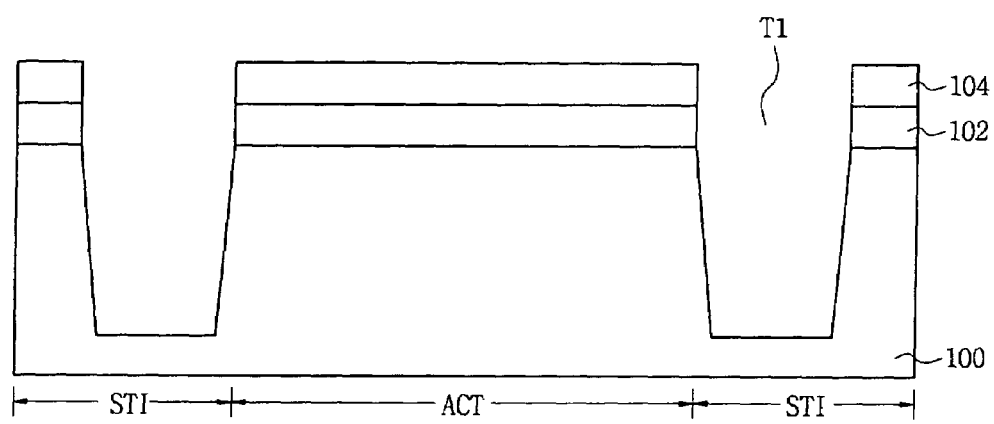
Figure 2D:
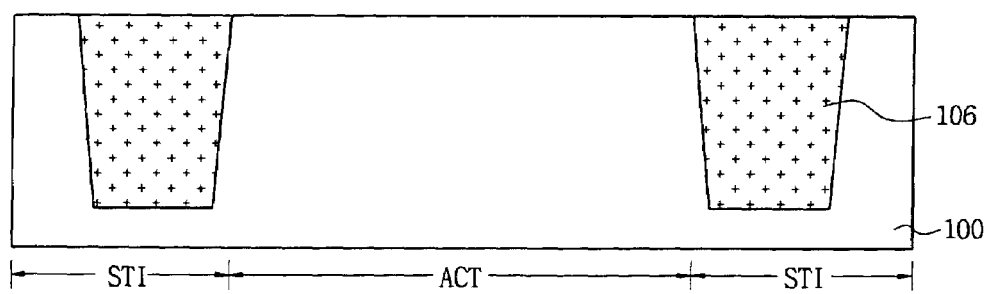
Figure 2E:
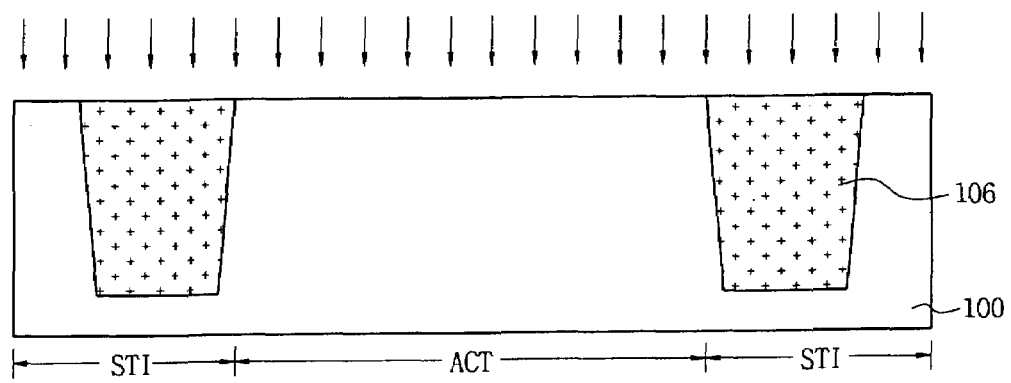
Figure 2F:
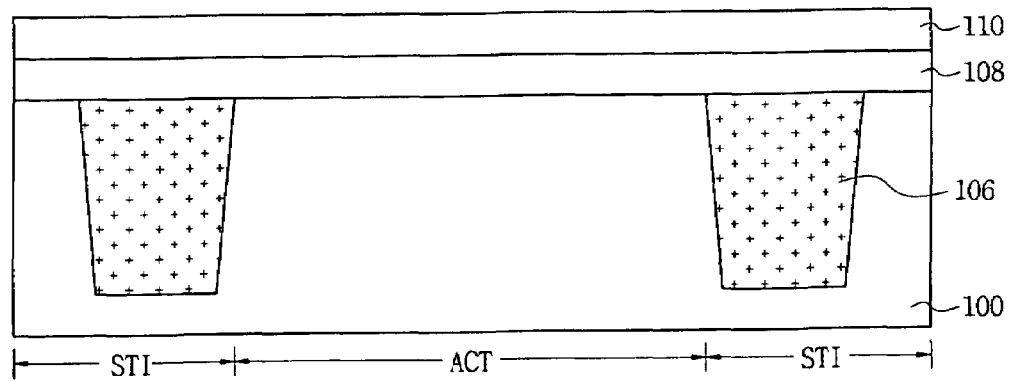
Figure 2G:
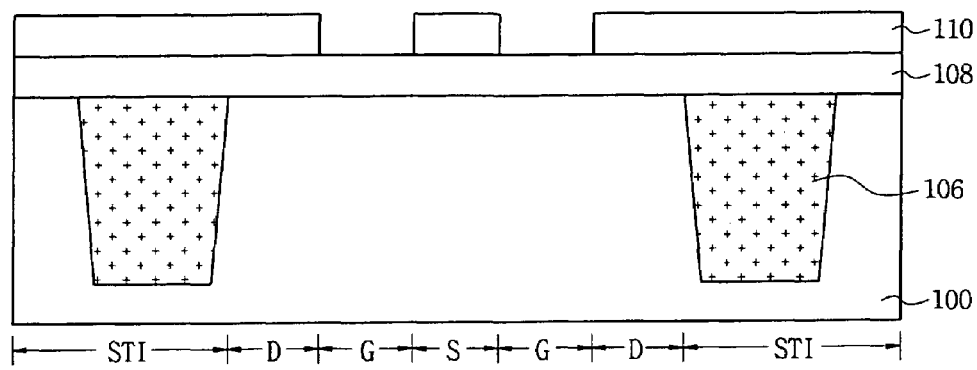
Figure 2H:
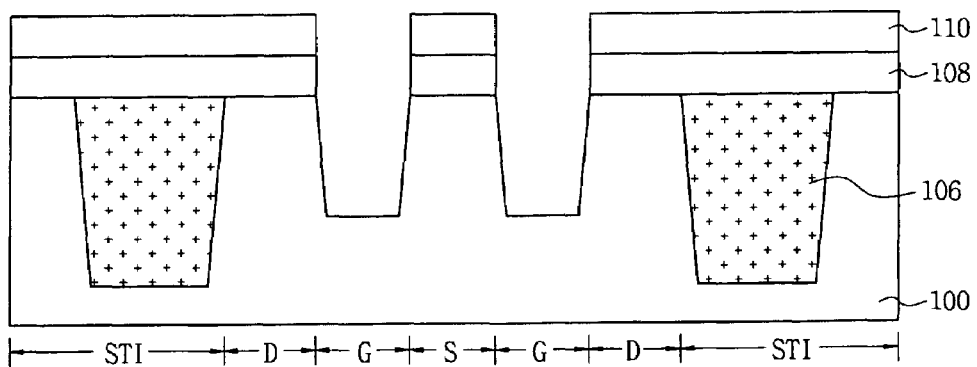
Figure 2I:
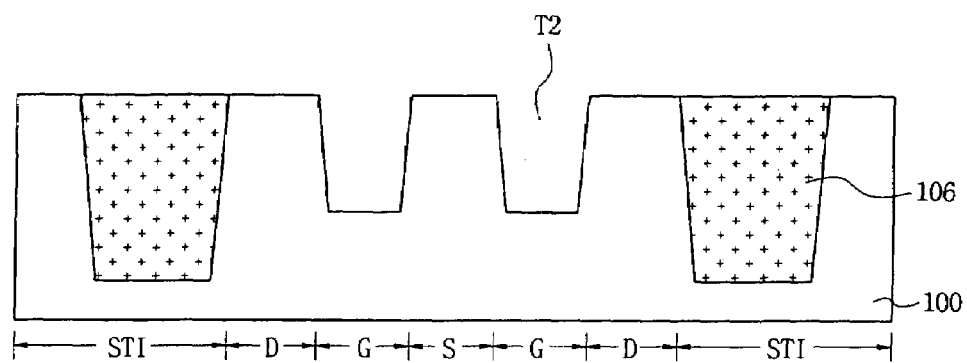
Figure 2J:
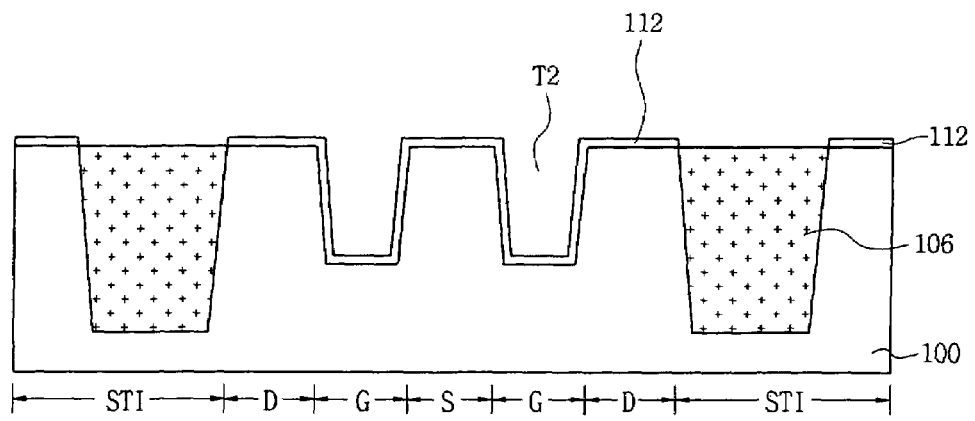
Figure 2K:
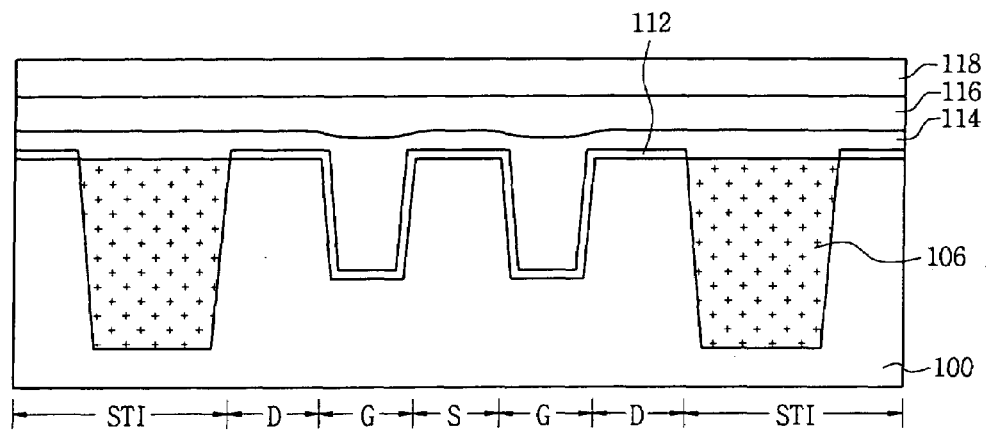
Figure 2L:
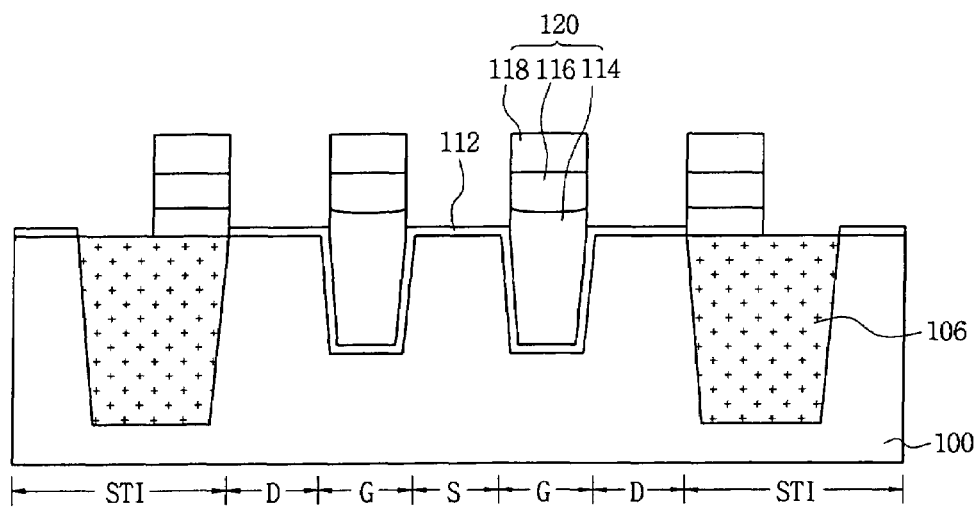
Figure 2M:
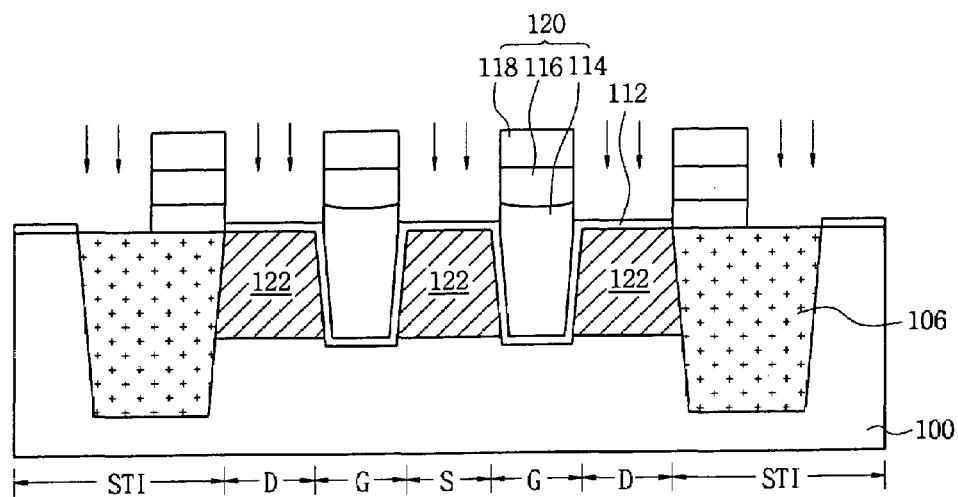
Figure 2N:
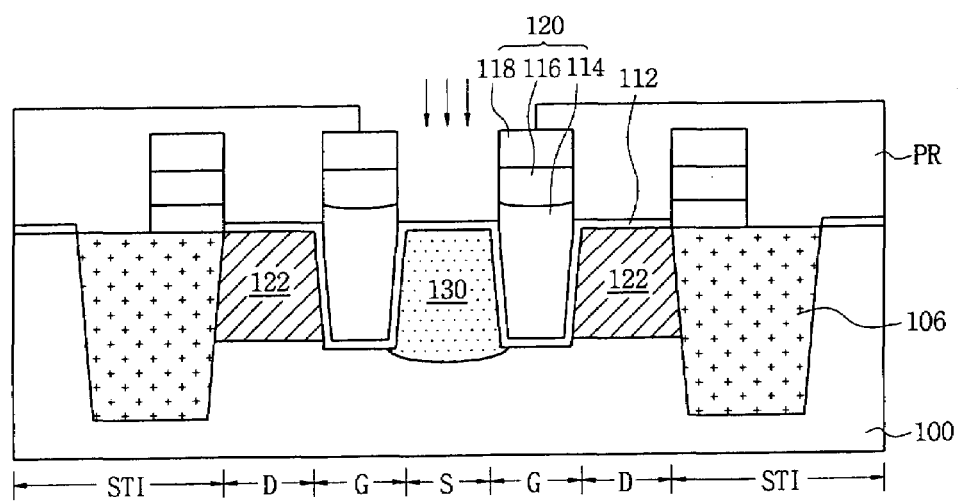
Figure 2O:
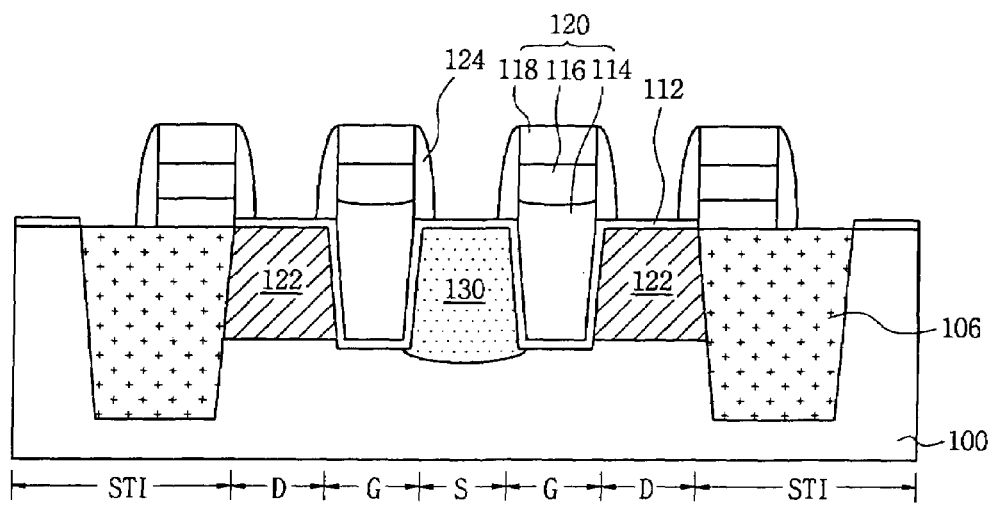
Figure 2P:
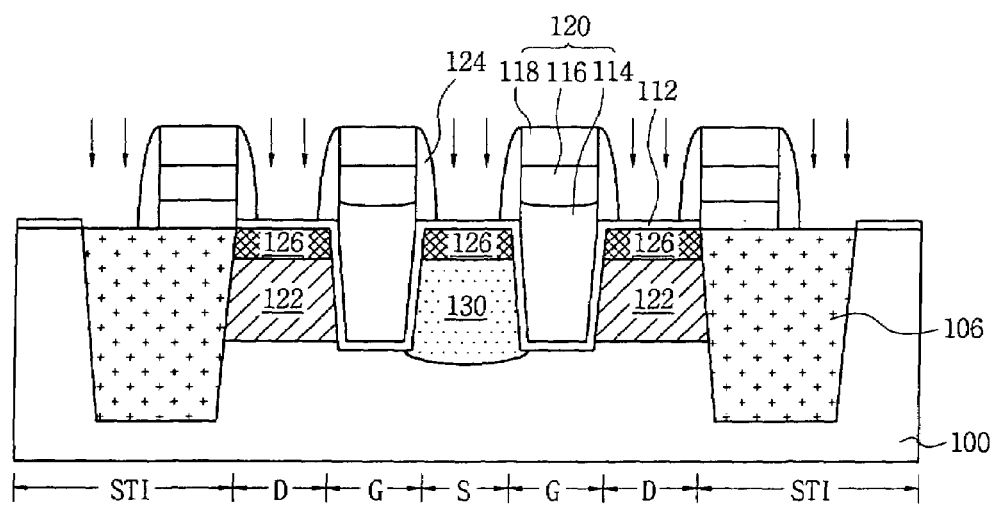
Figure 2Q:
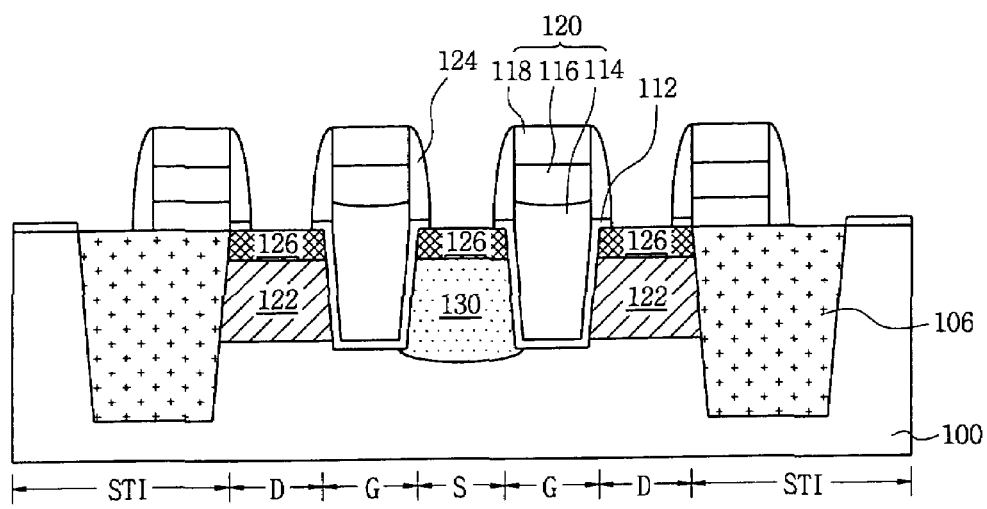
Figure 2R:
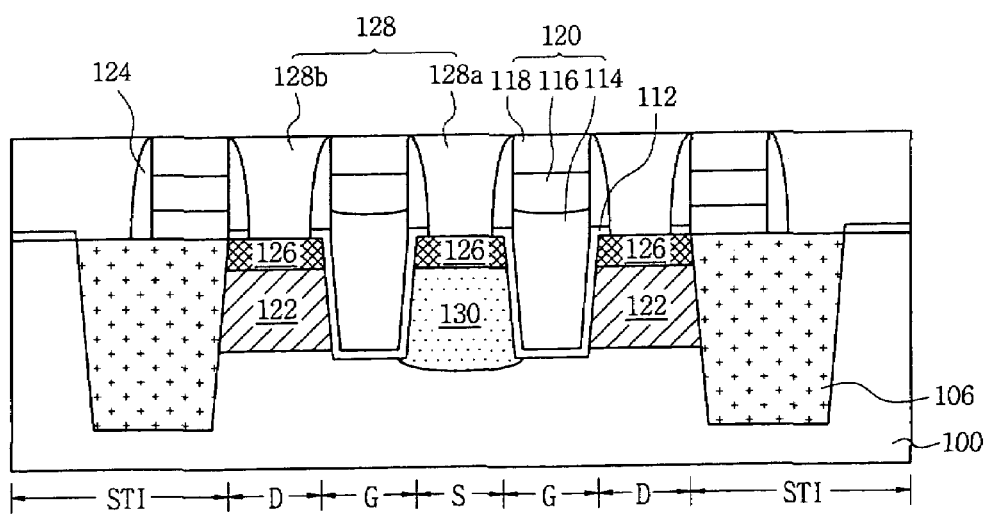

FIGS. 2A to 2R are cross-sectional views illustrating sequential steps for fabricating a MOS transistor having a trench-type gate with an asymmetric channel region, according to an embodiment of the present invention. Referring to FIG. 2A, a first pad oxide layer 102 and a first hard mask layer 104 are sequentially deposited on a semiconductor substrate 100. The first pad oxide layer 102 is formed to have a thickness of about 300 Å to about 1000 Å in an MTO (Medium Temperature Oxide) deposition process in one embodiment of the present invention.

The first hard mask layer 104 is comprised of silicon nitride or silicon oxy-nitride having a thickness of about 500 Å to about 2000 Å in one embodiment of the present invention. The first hard mask layer 104 is deposited during a chemical vapor deposition (CVD) process in one embodiment of the present invention. Though not shown in the figures, the present invention may also be practiced with a molding polysilicon layer formed between the first pad oxide layer 102 and the first hard mask layer 104. However, the present invention may be practiced with or without such a molding polysilicon layer.

Referring to FIGS. 2A and 2B, photoresist is deposited and patterned on the first hard mask layer 104 in a photolithography process. Exposed portions of the first hard mask layer 104 are etched away to expose portions of the first pad oxide layer 102. Such exposed portions of the first hard mask layer 104 are etched away in an anisotropic dry etch process with the first pad oxide layer 102 being an etch stop. Thereafter, the photoresist on the first hard mask 104 is removed.

Referring to FIGS. 2B and 2C, exposed portions of the first pad oxide layer 102 are etched away to expose portions of the semiconductor substrate 100. Such an etching process of the first pad oxide layer 102 is referred to as a BT (Break-Through) process which is a dry etch process with the semiconductor substrate 100 being an etch stop.

Thereafter, exposed portions of the semiconductor substrate 100 are etched down to a predetermined depth in a range of from about 2000 Å to about 5000 Å. The first hard mask layer 104 and the first pad oxide layer 102 act as etch masks during such a etching of the semiconductor substrate 100 to thus form a first trench T1 surrounding an active device region ACT. The process of etching the semiconductor substrate 100 to form the first trench T1 is referred to as an ME (Main Etching) process.

The above described BT process and the ME process are performed in-situ within one reaction chamber in one embodiment of the present invention. For example, the BT and ME processes may be performed by a dry etch process for sequentially etching different layers of material with respective reactive gases for each of the layers of material.

Referring to FIGS. 2C and 2D, the exposed semiconductor substrate 100 at the walls of the first trench T1 is oxidized in a thermal oxidation process to fill the first trench T1 with an insulating material 106 such as silicon dioxide ($SiO_2$). The first hard mask layer 104 is used as an oxidation prevention mask such that the insulating material 106 is formed just in the first trench T1. If a molding polysilicon layer were formed between the first pad oxide layer 102 and the first hard mask layer 104, such a molding polysilicon layer would buffer the stress caused by volume expansion from the insulating material 106 filling the first trench T1.

Subsequently, a CMP (chemical mechanical polishing) or an etch-back process is performed to planarize the materials on the semiconductor substrate 100 until the active device region ACT is exposed. As a result in FIG. 2D, the insulating material 106 is contained within the first trench T1 to form a STI (shallow trench isolation) structure.

Referring to FIGS. 2D and 2E, a first dopant of a first conductivity type is implanted into the semiconductor substrate 100 including the active device region ACT. In one embodiment of the present invention, the first dopant is a P-type dopant such as boron or $BF_2$ that is implanted with a concentration of about $1.0\times10^{12}$ atoms/cm$^2$ to about $1.0\times10^{14}$ atoms/cm$^2$ and with an energy of about 100 KeV to about 500 KeV. Such a first dopant forms a P-well within the active device region ACT and affects the doping within a channel region of the MOS transistor. The P-well is formed into the depth of the semiconductor substrate 100 illustrated in the figures such that a specific reference number is not shown for the P-well in the figures. However, formation of such a P-well within a semiconductor substrate is individually known to one of ordinary skill in the art.

Though not shown in the drawings, the present invention may be practiced when another dopant that is an N-type dopant such as arsenic or phosphorus is also ion implanted. Such an N-type dopant would be implanted with a relatively low concentration such as about $1.0\times10^{12}$ atoms/cm$^2$ to about $1.0\times10^{14}$ atoms/cm$^2$ and with energy of about 20 KeV to about 50 KeV. Such an N-type dopant implanted into the channel region is used for determining the threshold voltage of the MOS transistor. However, the present invention may be practiced with or without such an additional N-type dopant for the channel region of the MOS transistor.

Referring to FIGS. 2E and 2F, a second pad oxide layer 108 and a second hard mask layer 110 are sequentially deposited on the semiconductor substrate 100. The second pad oxide layer 108 is formed to have a thickness of about 200 Å to about 500 Å in a MTO (Medium Temperature Oxide) deposition process. The second hard mask layer 110 is deposited to be comprised of silicon nitride or silicon oxy-nitride (SiON) with a thickness of about 300 Å to about 1000 Å in a CVD (Chemical Vapor Deposition) process.

Referring to FIGS. 2F and 2G, photoresist is deposited and patterned on the second hard mask layer 110 in a photolithography process to expose portions of the second hard mask layer 110 over a gate region G. Such exposed portions of the second hard mask layer 110 are etched away in a dry etch process to expose portions of the second pad oxide layer 108. The second pad oxide layer 108 is an etch stop during etching of the second hard mask layer 110. Thereafter, the photoresist is removed.

Referring to FIGS. 2G and 2H, exposed portions of the second pad oxide layer 108 are etched away to expose portions of the semiconductor substrate 100 in a dry etch process using the second hard mask layer 110 as an etch mask. Exposed portions of the semiconductor substrate 100 are etched away to a predetermined depth to form a second trench T2. The second hard mask layer 110 and the second pad oxide layer 108 act as etch mask layers during formation of the second trench T2 and define the critical dimensions of the second trench T2.

In one embodiment of the present invention, the second hard mask layer 110 is a sacrificial layer that is entirely or partially etched during formation of the second trench T2. The BE process for patterning the second pad oxide layer 108 and the ME process for patterning the semiconductor substrate 100 to form the second trench T2 are performed in situ with different kinds of reactive gases in one etching apparatus.

Because the depth of the second trench T2 may vary depending on the open critical dimension (i.e., a dimension parallel to the surface of the semiconductor substrate 100), the second trench T2 is formed to have a uniform open critical dimension (CD) for a uniform depth. For example, the second trench T2 is formed to have the open CD of about 500 Å to about 1000 Å and a depth of about 1000 Å to about 2000Å.

Though not shown in the drawings, the present invention may be practiced with another etching process being performed after forming the second trench T2 for further etching into the sidewalls of the second trench T2. Such an additional etching process may be an isotropic CDE (Chemical Dry Etch) process or an isotropic wet etch process. Such additional etching into the sidewalls of the second trench T2 further separates a source region S from a drain region D and increases the depth of the second trench T2. The present invention may be practiced with or without such an additional etch into the sidewalls of the second trench T2.

Referring to FIGS. 2H and 2I, the second hard mask layer 110 and the second pad oxide layer 108 are removed through a wet etch process to expose surfaces of the semiconductor substrate 100. Referring to FIGS. 2I and 2J, a gate dielectric 112 is formed on exposed surfaces of the semiconductor substrate 100 including at the walls of the second trench T2. The gate dielectric 112 is comprised of silicon dioxide ($SiO_2$) having a thickness of about 30 Å to about 120 Å formed in a thermal oxidation process in one embodiment of the present invention.

Referring to FIGS. 2J and 2K, a gate electrode 114 is blanket deposited to fill the second trench T2. The gate electrode 114 is comprised of polysilicon deposited in a CVD (chemical vapor deposition) process in one embodiment of the present invention. In addition, a metal layer 116 is deposited on the gate electrode 114 and is comprised of metal silicide such as tungsten silicide or titanium silicide in one embodiment of the present invention. Thereafter, an upper gate insulating layer 118 comprised of silicon nitride for example is deposited on the metal layer 116.

Referring to FIGS. 2K and 2L, photoresist is deposited and patterned on the upper gate insulating layer 118 in a photolithography process. Portions of the upper gate insulating layer 118, the metal layer 116, and the gate electrode 114 over the source and drain regions S and D and the device isolation film 106 are sequentially etched away in a dry etch process by using the photoresist as an etch mask. After such patterning, a gate stack 120 comprised of a gate electrode 114, a gate silicide 116, and an gate insulating structure 118 is formed on the gate region G, as illustrated in FIG. 2L.

Referring to FIGS. 2L and 2M, an N-type dopant is implanted into the source and drain regions S and D with a relatively low concentration of about $1.0\times10^{12}$ atoms/cm$^2$ to about $1.0\times10^{13}$ atoms/cm$^2$ and with energy of about 20 KeV to about 50 KeV to form LDD (lightly doped drain) regions 122. During such implantation, the gate stack 120 acts as an ion implantation mask. The present invention may be practiced when the LDD regions 122 are formed to be either deeper than or shallower than the second trench T2. In an alternative embodiment of the present invention, the LDD regions 122 may be formed after forming the P-well in FIG. 2E and before forming the second trench T2.

Referring to FIGS. 2M and 2N, photoresist PR is deposited and patterned in a photolithography process with a portion of the photoresist being removed from the source region S. Thereafter, a second dopant having the first conductivity type of the dopant within the channel region (i.e., the P-well) is implanted into the source region S to form a channel stopping region 130.

In one embodiment of the present invention, when the P-well is formed in FIG. 2E, the second dopant for forming the channel stopping region 130 is a P-type dopant such as boron or $BF_2$ implanted with a relatively high concentration of about $1.0\times10^{13}$ atoms/cm$^2$ to about $1.0\times10^{15}$ atoms/cm$^2$ and with energy of about 30 KeV to about 70 KeV. During such implantation, the photoresist PR and the gate stack 120 act as ion implantation masks.

In one embodiment of the present invention, the channel stopping region 130 is deeper than the LDD region 122 formed in the source region S. The present invention may be practiced with the channel stopping region 130 being shallower than the second trench T2. Alternatively, the present invention may be practiced with the channel stopping region 130 extending beyond the depth of the second trench T2 to the gate region G under the second trench T2.

After formation of the channel stopping region 130, the photoresist PR is removed. Referring to FIG. 2O, a spacer 124 is formed at sidewalls of the gate stack 120. For formation of such a spacer 124, an insulating material such as silicon nitride, silicon oxy-nitride, or silicon dioxide is conformally deposited in a CVD (chemical vapor deposition) process. Such insulating material is then anisotropically dry etched to form the spacer 124 comprised of the insulating material.

Referring to FIGS. 2O and 2P, a third dopant of a second conductivity type opposite to the first conductivity type of the dopant of the channel stopping region 130 is implanted into the source and drain regions, S and D. For example, when the channel stopping region 130 is formed with a P-type dopant, an N-type dopant such as As or phosphorous is ion implanted with a relatively high concentration of about $1.0\times10^{15}$ atoms/cm$^2$ to about $1.0\times10^{16}$ atoms/cm$^2$ and with energy of about 10 KeV to about 30 KeV. Such implantation is self aligning with the spacer 124 and the gate stack 120 acting as ion implantation masks. In addition, such implantation forms source and drain junctions 126.

A source junction 126 is formed for a source of the MOS transistor in a source region S, and a drain junction 126 is formed for a drain of the MOS transistor in a drain region D. The source junction 126 should not be formed deeper than the channel stopping region 130 such that the source junction 126 is completely contained within the channel stopping region 130. In addition, the drain junction D should not be formed deeper than the LDD region 122 such that the drain region 126 is completely contained within the LDD region 122.

Referring to FIGS. 2P and 2Q, the portions of the gate dielectric 112 over the source and drain regions S and D are removed. Referring to FIGS. 2Q and 2R, a conductive material such as polysilicon with an N-type dopant is blanket deposited on the semiconductor substrate 100. Subsequently, a CMP (chemical mechanical polishing) process is performed until the gate insulating structure 118 is exposed to form source and drain electrodes 128a and 128b, respectively. The source electrode 128a is electrically coupled to the source junction 126 in the source region S, and the drain electrode 128b is electrically coupled to the drain junction 126 in the drain region D.

Subsequently, an interlayer insulating material is deposited, and a portion of such an interlayer insulating material over the source region S is etched away to form a source contact hole. When the MOS transistor is used within a memory cell, a bit line contact fills such a source contact hole to be electrically coupled to the source electrode 128a. An additional interlayer insulating material is deposited to surround the bit line contact, and a portion of such interlayer insulating materials over the drain region D is etched away to form a drain contact hole. A storage electrode fills such a drain contact hole to be electrically coupled to the drain electrode 128b.

In addition, a dielectric layer and a plate electrode are also formed for a cell capacitor that stores data charge when the MOS transistor of FIG. 2R is used within a memory cell. However, the MOS transistor of FIG. 2R may be used within any other types of integrated circuits employing a transistor.

In this manner referring to FIG. 2R, an NMOSFET (N-channel metal oxide semiconductor field effect transistor) is formed with the source and drain junctions 126 having N-type dopant therein. The channel stopping region 130 with the P-type dopant is formed just within the source region S such that the NMOSFET of FIG. 2R is asymmetric. The portion of the P-well of the semiconductor substrate 100 abutting the gate dielectric 112 forms the channel region of the MOS transistor in FIG. 2R.

Because the source junction 126 is completely contained within the P-type channel stopping region 130, short channel effects are reduced in the MOS transistor of FIG. 2R. By decreasing short channel effects, the dimensions of the second trench T2 including the depth and the open critical dimension may be reduced such that the MOS transistor of FIG. 2R may be fabricated with higher density. In addition, with the P-type channel stopping region 130, the threshold voltage of the MOS transistor of FIG. 2R may be advantageously increased for reducing undesired leakage current.

Furthermore, by using the P-type channel stopping region 130 to adjust the threshold voltage of the MOS transistor of FIG. 2R, the concentration of the dopant implanted for forming the channel region in FIG. 2E and/or for forming the LDD region 122 in FIG. 2M may be reduced. With such lower dopant concentration in the channel region and the LDD region 122, junction leakage current in the drain region D is reduced for improved refresh characteristics when the MOS transistor of FIG. 2R forms part of a memory cell. In one embodiment of the present invention, with formation of the P-type channel stopping region 130, the implantation of the P-type dopant for the channel region in FIG. 2E may be eliminated.

The foregoing is by way of example only and is not intended to be limiting. For example, any specific types of processes mentioned for forming the end structures of the MOS transistor of FIG. 2R are by way of example only, and other types of processes may also be used to form the end structures of the MOS transistor of FIG. 2R. Furthermore, any dimensions and materials specified herein are by way of example only.

In addition, the present invention is described with the channel stopping region 130 formed to completely contain the source junction 126 within the source region S. However, the present invention may also be practiced with the channel stopping region 130 formed to completely contain the drain junction 126 within the drain region D (i.e., with the D and S region designations reversed in the figures).

Additionally, an NMOSFET has been formed in the FIGS. 2A to 2R. However, the present invention may be practiced for forming a PMOSFET when the dopant conductivity within the structures of the MOS transistor are reversed, as would be apparent to one of ordinary skill in the art from the description herein.

The present invention is limited only as defined in the following claims and equivalents thereof.

What is claimed is:

1. A method for fabricating a MOS (metal oxide semiconductor) transistor, comprising:
    forming a gate structure within a trench that is formed within a well doped with a first dopant of a first conductivity type;
    forming a gate dielectric at walls of the trench such that the gate dielectric is disposed between the gate structure and the well within the trench;
    implanting a second dopant of the first conductivity type to form a channel stopping region at a first side of the trench, wherein the depth of the channel stopping region extends beyond the depth of the trench, and wherein the channel stopping region is formed to abut the gate dielectric down to the whole death of the trench; and
    implanting a third dopant of a second conductivity type that is opposite of the first conductivity type to form a first source/drain within the channel stopping region;
    wherein a portion of the trench abuts the well for forming a channel of the MOS transistor.

2. The method of claim 1, further comprising:
    implanting the third dopant of the second conductivity type to form a second source/drain at a second side of the trench.

3. The method of claim 2, further comprising:
    implanting a fourth dopant of the second conductivity type to form a lightly doped region, wherein the second source/drain is formed within the lightly doped region.

4. The method of claim 2, wherein the first source/drain is a source of the MOS transistor, and wherein the second source/drain is a drain of the MOS transistor.

5. The method of claim 1, wherein the first conductivity type is P-type and the second conductivity type is N-type such that the MOS transistor is an NMOSFET (N-channel Metal Oxide Semiconductor Field Effect Transistor).

6. The method of claim 5, wherein the first dopant for the well is comprised of boron, and wherein the second dopant for the channel stopping region is comprised of boron with a higher concentration than in the well, and wherein the third dopant for the first source/drain is one of arsenic or phosphorous.

7. The method of claim 1, wherein the step of forming the gate structure includes:
    forming a gate electrode to fill the trench.

8. The method of claim 7, wherein the step of forming the gate structure further includes:
    forming a gate silicide on the gate electrode;
    forming an insulating structure on the gate silicide; and
    forming a spacer formed at sidewalls of the gate silicide and the insulating structure.

9. The method of claim 8, further comprising:
    forming a drain/source electrode on the first drain/source and to the side of the spacer.

10. The method of claim 1, wherein the MOS transistor is formed within an active device region surrounded by STI (shallow trench isolation) structures.

11. The method of claim 1, wherein the channel stopping region is formed to abut the gate dielectric also along a portion of a bottom of the trench.

* * * * *